(12) United States Patent
Williams

(10) Patent No.: US 10,539,102 B2
(45) Date of Patent: Jan. 21, 2020

(54) PRO STOCK FUEL INJECTION AIR INTAKE ASSEMBLY

(71) Applicant: K&N Engineering, Inc., Riverside, CA (US)

(72) Inventor: Steve Williams, Beaumont, CA (US)

(73) Assignee: K&N Engineering, Inc., Riverside, CA (US)

( * ) Notice: Subject to any disclaimer, the term of this patent is extended or adjusted under 35 U.S.C. 154(b) by 25 days.

(21) Appl. No.: 15/453,622

(22) Filed: Mar. 8, 2017

(65) Prior Publication Data
US 2017/0260939 A1 Sep. 14, 2017

Related U.S. Application Data

(60) Provisional application No. 62/305,394, filed on Mar. 8, 2016.

(51) Int. Cl.
*F02M 35/10* (2006.01)
*F02M 35/16* (2006.01)

(52) U.S. Cl.
CPC ........... *F02M 35/10124* (2013.01); *F02M 35/10019* (2013.01); *F02M 35/10098* (2013.01); *F02M 35/10118* (2013.01); *F02M 35/10144* (2013.01); *F02M 35/161* (2013.01)

(58) Field of Classification Search
CPC ............ F02M 35/10; F02M 35/10091; F02M 35/10098; F02M 35/10124
USPC ........................................ 123/184.21, 184.59
See application file for complete search history.

(56) References Cited

U.S. PATENT DOCUMENTS

| | | | | |
|---|---|---|---|---|
| 4,375,204 A | * | 3/1983 | Yamamoto | F02M 1/02 123/494 |
| 7,270,207 B2 | * | 9/2007 | Idei | F02B 61/02 180/219 |
| 8,739,752 B2 | * | 6/2014 | Honzawa | F02M 35/10013 123/184.21 |
| 9,643,483 B2 | * | 5/2017 | Cho | B60K 13/02 |

OTHER PUBLICATIONS

"Spectre Performance 743", Jan. 18, 2011, Summit Racing, https://web.archive.org/web/20110118054113/https://www.summitracing.com/parts/spe-743/.*
"LG Carbon Air Intake for LS7/LS3", LG Motor Sports, Retrieved Oct. 5, 2013.*

* cited by examiner

*Primary Examiner* — Erick R Solis
*Assistant Examiner* — Robert A Werner
(74) *Attorney, Agent, or Firm* — Rutan & Tucker LLP; Hani Z. Sayed

(57) ABSTRACT

An apparatus and a method are provided for an air intake assembly configured for use with Pro Stock vehicles comprising fuel injection equipped engines. The air intake assembly comprises an air inlet that includes a distal opening disposed in a forward direction at a front of the vehicle and configured to direct incident air into the air intake assembly. An air duct is joined with the air inlet by way of a first coupler configured to maintain an airtight seal between the air inlet and the air duct. A throttle body adapter is joined with the air duct by way of a second coupler configured to maintain an airtight seal therebetween. The throttle body adapter is configured to establish an airtight coupling between the air intake assembly and a throttle body of the engine, such that the incident air is directed into the throttle body.

20 Claims, 10 Drawing Sheets

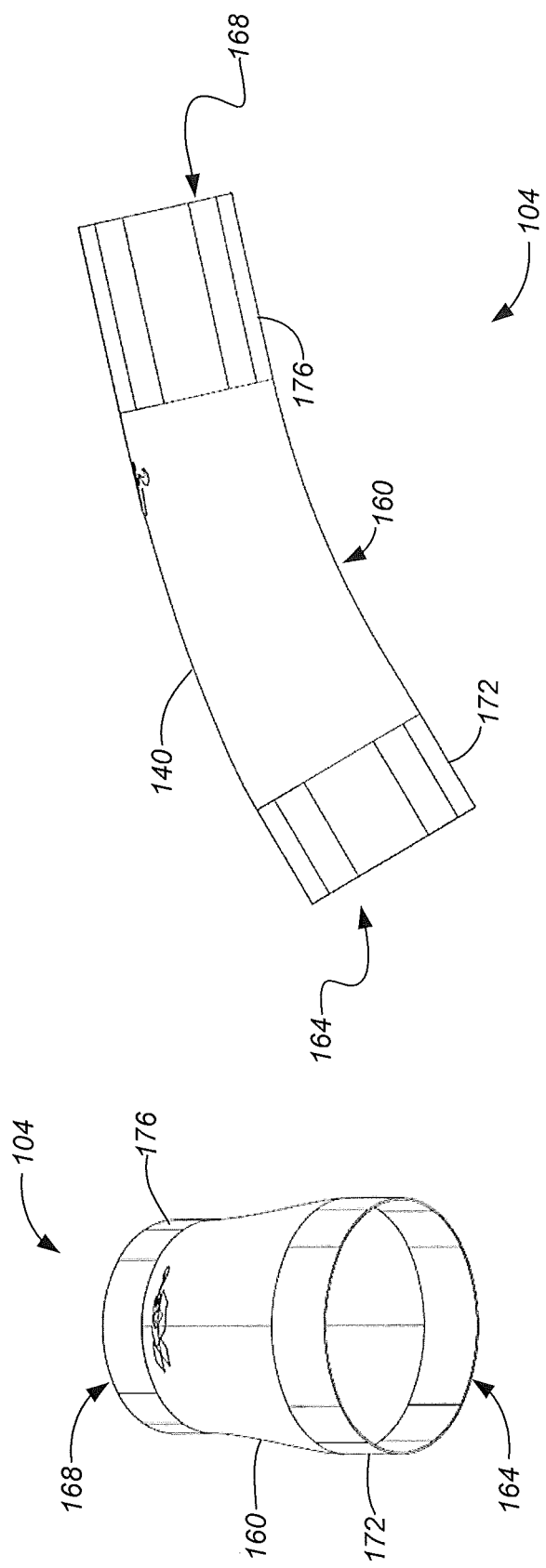

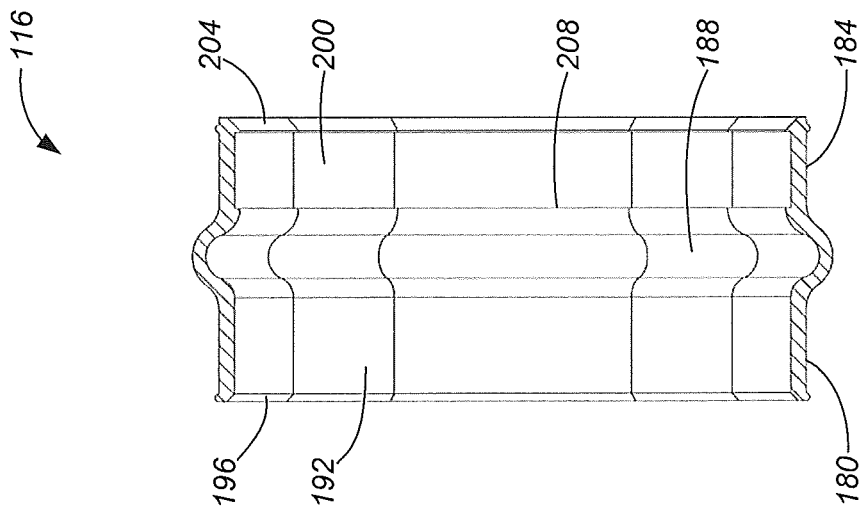
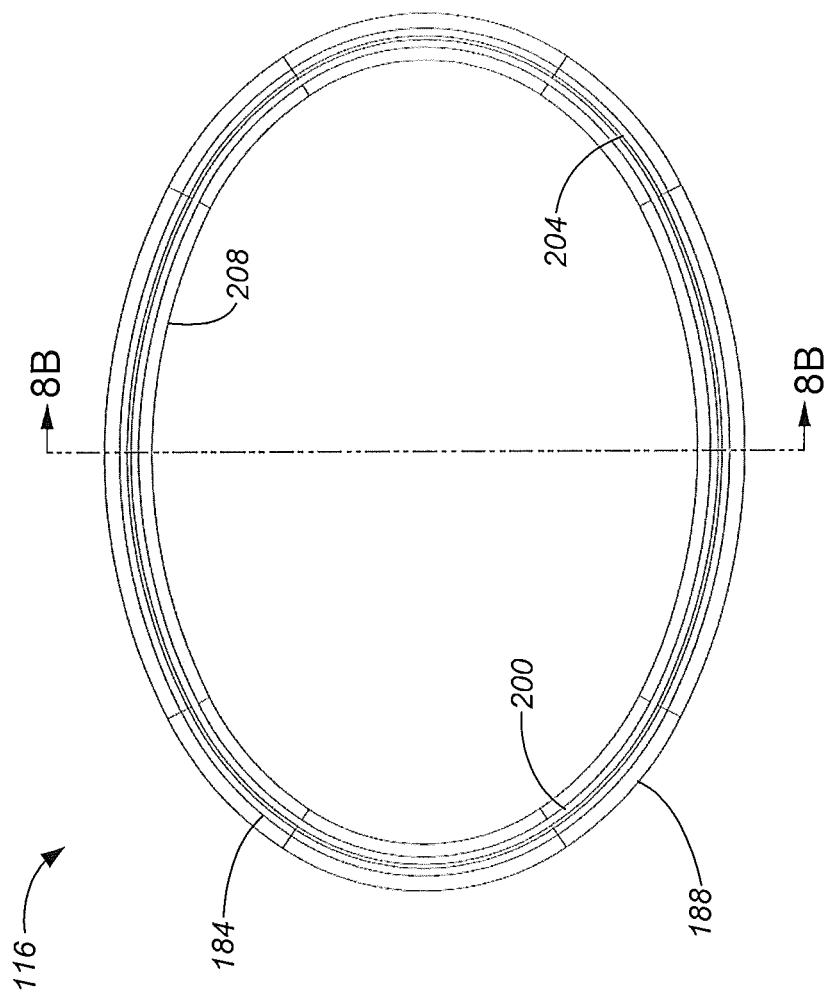
FIG. 8B
FIG. 8A

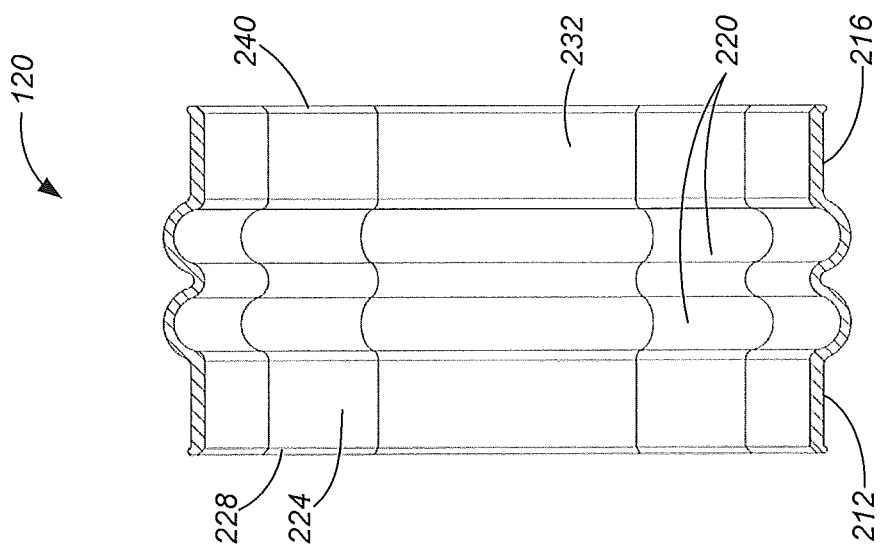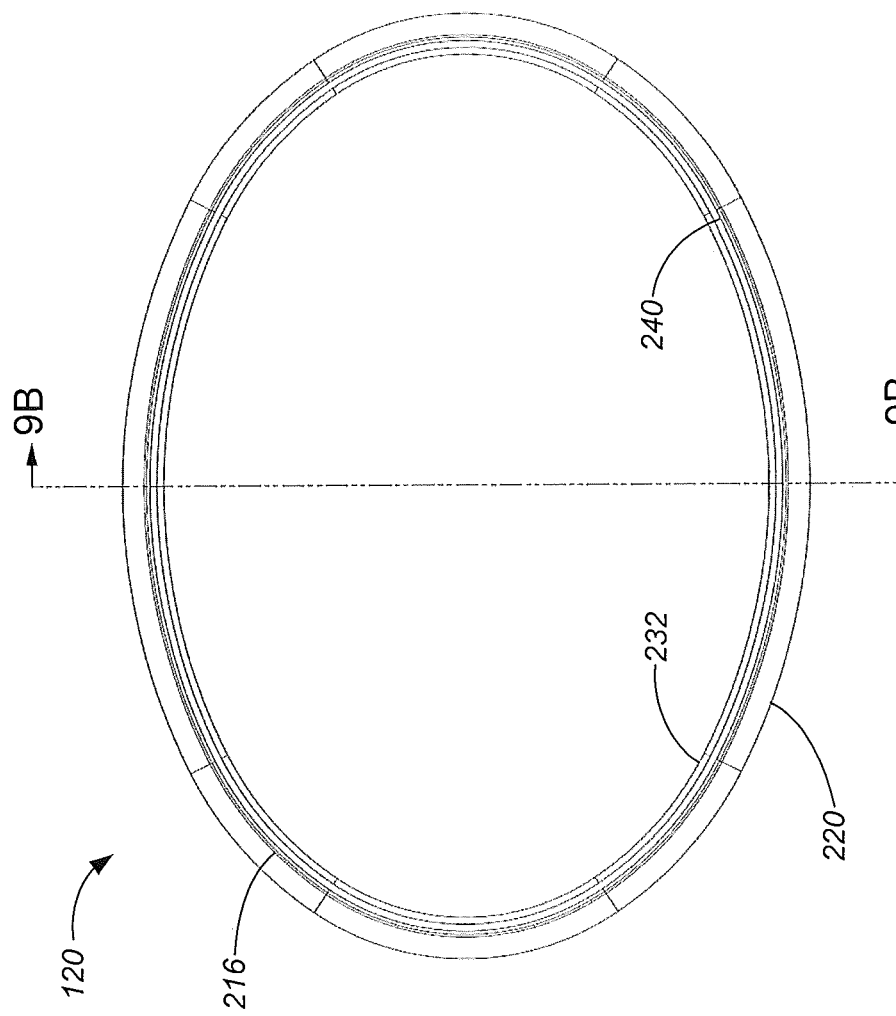

PRO STOCK FUEL INJECTION AIR INTAKE ASSEMBLY

PRIORITY

This application claims the benefit of and priority to U.S. Provisional Application, entitled "Pro Stock Fuel Injection Air Intake Assembly," filed on Mar. 8, 2016 and having application Ser. No. 62/305,394.

FIELD

The field of the present disclosure generally relates to air intake assemblies. More particularly, the field of the invention relates to an apparatus and a method for an air intake assembly for Pro Stock engines equipped with throttle body electronic fuel injection.

BACKGROUND

Pro Stock Drag Racing is a class of drag racing featuring factory "Hot-Rods." The Pro Stock class often is referred to as "all motor," in reference to a prohibition against utilizing artificial induction, such as turbocharging, supercharging, or nitrous oxide. Very strict rules govern modifications to engines and types of car bodies that may be used for Pro Stock racing. In general, the engine and the car body must be manufactured by the same manufacturer. Although no engine currently being raced in Pro Stock is produced on any manufacturer's assembly line, all of the raw components are widely available. Engine blocks and cylinder heads often are provided in a "raw" condition with only approximate dimensions and rough machining, allowing each racing team to machine and modify the parts to their own standards.

Engines may be either four-barrel carburetors or throttle body electronic fuel injection (EFI) and must be naturally aspirated. Although intake manifolds and cylinder heads are open to modification, for many decades the "tunnel ram" has remained the most effective intake manifold configuration. Since the length and confirmation of the intake passages are critical to engine power output, carburetors typically are raised above the engine, necessitating a large hood scoop that has long been a signature of the Pro Stock class. In instances wherein a hood scoop is absent, such as in the case of throttle body EFI, a relatively smaller space exists between the throttle body and the inside of the hood. Thus, intake air must be conveyed to the intake by way of a low profile air intake assembly that preferably offers advantageously little resistance to the air being conveyed to the intake. What is needed, therefore, is an air intake assembly for Pro Stock engines equipped with throttle body EFI in absence of a hood scoop.

SUMMARY

An apparatus and a method are provided for an air intake assembly for use with Pro Stock vehicles including throttle body electronic fuel injection (EFI) equipped engines. The aft intake assembly comprises an air inlet that is configured to be disposed at a front of a vehicle. The air inlet is comprised of a nearly rectangular cross-sectional shape at a distal opening that is configured to receive a relatively large volume of incident air during forward movement of the vehicle. An air duct is configured to receive an airstream of the incident air from the air inlet. The air duct comprises an elongate tube that is configured to provide a smooth transfer of the airstream from the air inlet into the air duct. A throttle body adapter is configured to couple the air duct with the throttle body EFI. A distal portion of the throttle body adapter is configured to be joined with the air duct by way of a coupler. A proximal portion of the throttle body adapter is configured to be fastened onto the throttle body. A central opening of the throttle body adapter is configured to conduct the airstream from the air duct to the throttle body with advantageously little air turbulence. An inner surface of the central opening is configured to encourage laminar air flow of the airstream.

In an exemplary embodiment, an air intake assembly configured for use with a Pro Stock vehicle comprising an engine equipped with a throttle body electronic fuel injection (EFI), comprises an air inlet configured to be disposed at a front of the vehicle; an air duct to receive incident air from the air inlet; and a throttle body adapter to couple the air duct with the throttle body EFI.

In another exemplary embodiment, wherein a first coupler is configured to maintain an airtight seal between the air inlet and the air duct. In another exemplary embodiment, wherein the first coupler is configured with a shape and a size that substantially match a shape and a size of an opening comprising each of the air inlet and the air duct, such that one or more interior surfaces of the first coupler may be received onto smooth exterior surfaces of the air inlet and the air duct so as to form a substantially airtight seal therebetween. In another exemplary embodiment, wherein the first coupler is comprised of a distal portion and a proximal portion that share an intervening flexible portion configured to allow movement between the air duct and the air inlet. In another exemplary embodiment, wherein the first coupler is comprised of a circumferential lip configured to prevent a distal-most edge of the air duct from being pushed into the flexible portion, the circumferential lip providing a smooth transitional surface configured to reduce air turbulence within an airstream flowing near the distal-most edge of the air duct.

In another exemplary embodiment, wherein a second coupler is configured to maintain an airtight seal between the air duct and the throttle body adapter, such that the incident air is directed to the throttle body EFI. In another exemplary embodiment, wherein the second coupler is configured with a shape and a size that substantially match a shape and a size of an opening comprising each of the air duct and the throttle body adapter, such that one or more interior surfaces of the second coupler may be received onto smooth exterior surfaces of the air duct and the throttle body adapter, such that the incident air is directed to the throttle body EFI. In another exemplary embodiment, wherein the second coupler is comprised of a distal portion and a proximal portion that share a pair of intervening flexible portions configured to allow movement of the air duct relative to the throttle body adapter.

In another exemplary embodiment, wherein the air inlet and the air duct are configured to provide a direct route for air to be conducted from the front of the vehicle to the throttle body. In another exemplary embodiment, wherein the air inlet is comprised of a nearly rectangular cross-sectional shape at a distal opening that is configured to receive a relatively large volume of the incident air during forward movement of the vehicle. In another exemplary embodiment, wherein the air inlet is comprised of a reverse curve-shape that extends proximally from the distal opening toward the air duct, the reverse curve comprising an upwardly concave portion that is followed by an upwardly convex portion. In another exemplary embodiment, wherein the air inlet is hollow and comprised of a tapered portion that extends from the distal opening to a proximal opening that is configured to smoothly couple with the air duct so as to conduct an airstream from the air inlet to the air duct with relatively little turbulence.

In another exemplary embodiment, wherein the air duct comprises an elongate tube having a shape and size that taper from a distal inlet opening to a proximal throttle opening, the distal inlet opening being comprised of a shape and a size that are substantially similar to a shape and a size of a proximal opening of the air inlet, thereby providing a smooth transfer of an airstream from the air inlet into the air duct. In another exemplary embodiment, wherein the proximal throttle opening is comprised of a cross-sectional shape and a size that are substantially similar to a cross-sectional shape and a size of the throttle body adapter.

In another exemplary embodiment, wherein the throttle body adapter is comprised of a proximal portion configured to be fastened onto the throttle body and a distal portion configured to be joined with the air duct by way of the second coupler. In another exemplary embodiment, wherein a central opening comprising the throttle body adapter is configured to conduct an airstream to the throttle body with advantageously little air turbulence, an inner surface of the central opening being configured to encourage laminar air flow of the airstream.

In an exemplary embodiment, a method for an air intake assembly for use with a Pro Stock vehicle comprising an engine equipped with an electronic fuel injection (EFI), comprises configuring an air inlet to direct incident air at a front of the vehicle into the air intake assembly; maintaining an airtight seal between the air inlet and an air duct by way of a first coupler; joining the air duct with a throttle body adapter by way of a second coupler; and establishing an airtight coupling between the throttle body adapter and a throttle body of the engine, such that the incident air is directed into the throttle body.

In another exemplary embodiment, wherein configuring the air inlet further comprises forming the air inlet and the air duct to provide a direct route for the incident air to be conducted from the front of the vehicle to the throttle body of the engine. In another exemplary embodiment, wherein joining further comprises configuring a proximal portion of the throttle body adapter to be fastened onto the throttle body and configuring a distal portion of the throttle body adapter to be coupled with the air duct by way of the second coupler. In another exemplary embodiment, wherein establishing further comprises configuring a central opening of the throttle body adapter to encourage substantially laminar flow of an the incident air being conducted thereby to the throttle body.

BRIEF DESCRIPTION OF THE DRAWINGS

The drawings refer to embodiments of the present disclosure in which:

FIG. 7A illustrates a front plan view of the air duct of FIG. 6A, according to the present disclosure;

FIG. 7B illustrates a side plan view of the air duct of FIG. 6A, showing exemplary dimensions in inches, in accordance with the present disclosure;

FIG. 8A illustrates a rear plan view of an exemplary embodiment of a first coupler configured for use with an air intake assembly in accordance with the present disclosure;

FIG. 8B illustrates a cross-sectional view of the first coupler of FIG. 8A, taken along a line 8B-8B, according to the present disclosure;

FIG. 9A illustrates a rear plan view of an exemplary embodiment of a second coupler configured for use with an air intake assembly in accordance with the present disclosure;

FIG. 9B illustrates a cross-sectional view of the second coupler of FIG. 9A, taken along a line 9B-9B, according to the present disclosure;

Figure 1:
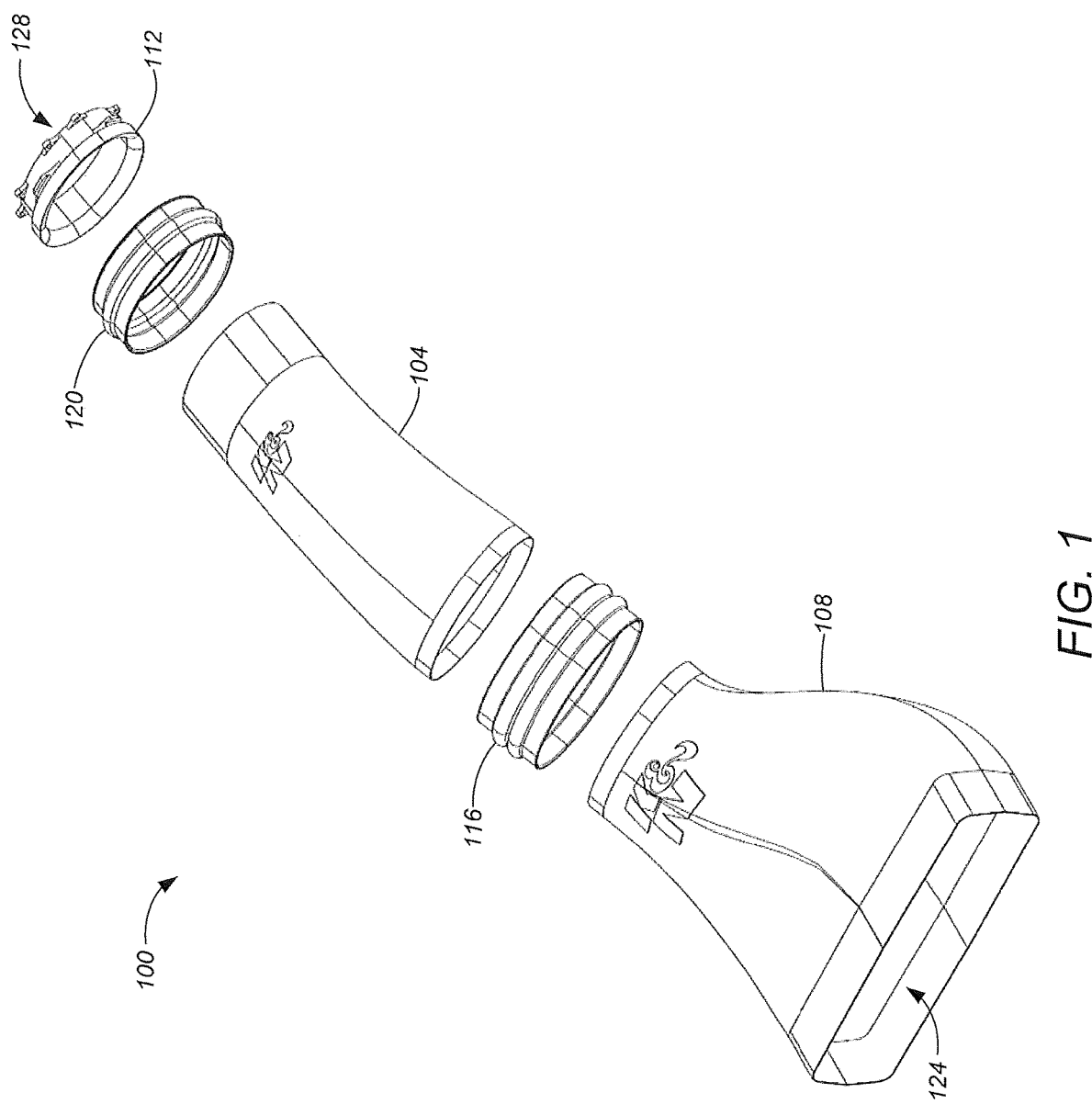
FIG. 1 illustrates an exploded perspective view of an exemplary embodiment of an air intake assembly, according to the present disclosure.

While the present disclosure is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the present disclosure.

DETAILED DESCRIPTION

In the following description, numerous specific details are set forth in order to provide a thorough understanding of the present disclosure. It will be apparent, however, to one of ordinary skill in the art that the invention disclosed herein may be practiced without these specific details. In other instances, specific numeric references such as "first opening," may be made. However, the specific numeric reference should not be interpreted as a literal sequential order but rather interpreted that the "first opening" is different than a "second opening." Thus, the specific details set forth are merely exemplary. The specific details may be varied from and still be contemplated to be within the spirit and scope of the present disclosure. The term "coupled" is defined as meaning connected either directly to the component or indirectly to the component through another component. Further, as used herein, the terms "about," "approximately," or "substantially" for any numerical values or ranges indicate a suitable dimensional tolerance that allows the part or collection of components to function for its intended purpose as described herein.

In general, the present disclosure describes an apparatus and a method for an air intake assembly configured for use with Pro Stock vehicles comprising throttle body electronic fuel injection (EFI) equipped engines. The air intake assembly comprises an air inlet that includes a distal opening disposed in a forward direction at a front of the vehicle and configured to direct incident air into the air intake assembly. The air inlet comprises a nearly rectangular cross-sectional shape at the distal opening and is configured to receive a relatively large volume of incident air into the air intake assembly during forward movement of the vehicle. An air duct is joined with the air inlet by way of a first coupler configured to maintain an airtight seal between the air inlet and the air duct. A throttle body adapter is joined with the air duct by way of a second coupler configured to maintain an airtight seal therebetween. The first and second couplers further comprise flexible portions that cooperate to substantially eliminate mechanical stresses on the air intake assembly and the throttle body of the fuel injection that may otherwise occur during movement of the engine relative to the surrounding engine bay. The throttle body adapter is configured to establish an airtight coupling between the air intake assembly and the throttle body of the engine, such that the incident air is directed into the throttle body.

Figure 2A:
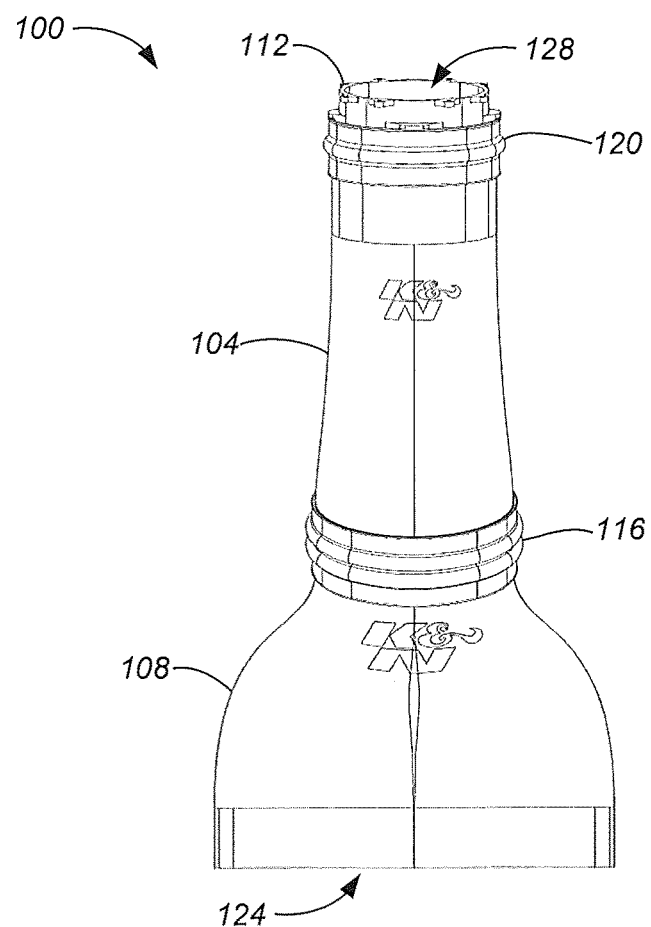
FIG. 2A illustrates a top plan view of the air intake assembly of FIG. 1, in accordance with the present disclosure.
Figure 2B:
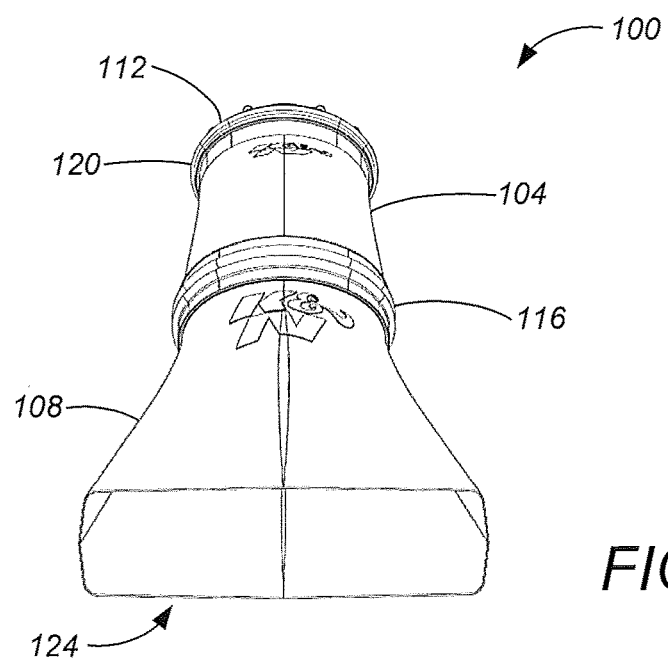
FIG. 2B illustrates a front plan view of the air intake assembly of FIG. 1, in accordance with the present disclosure.
Figure 3:
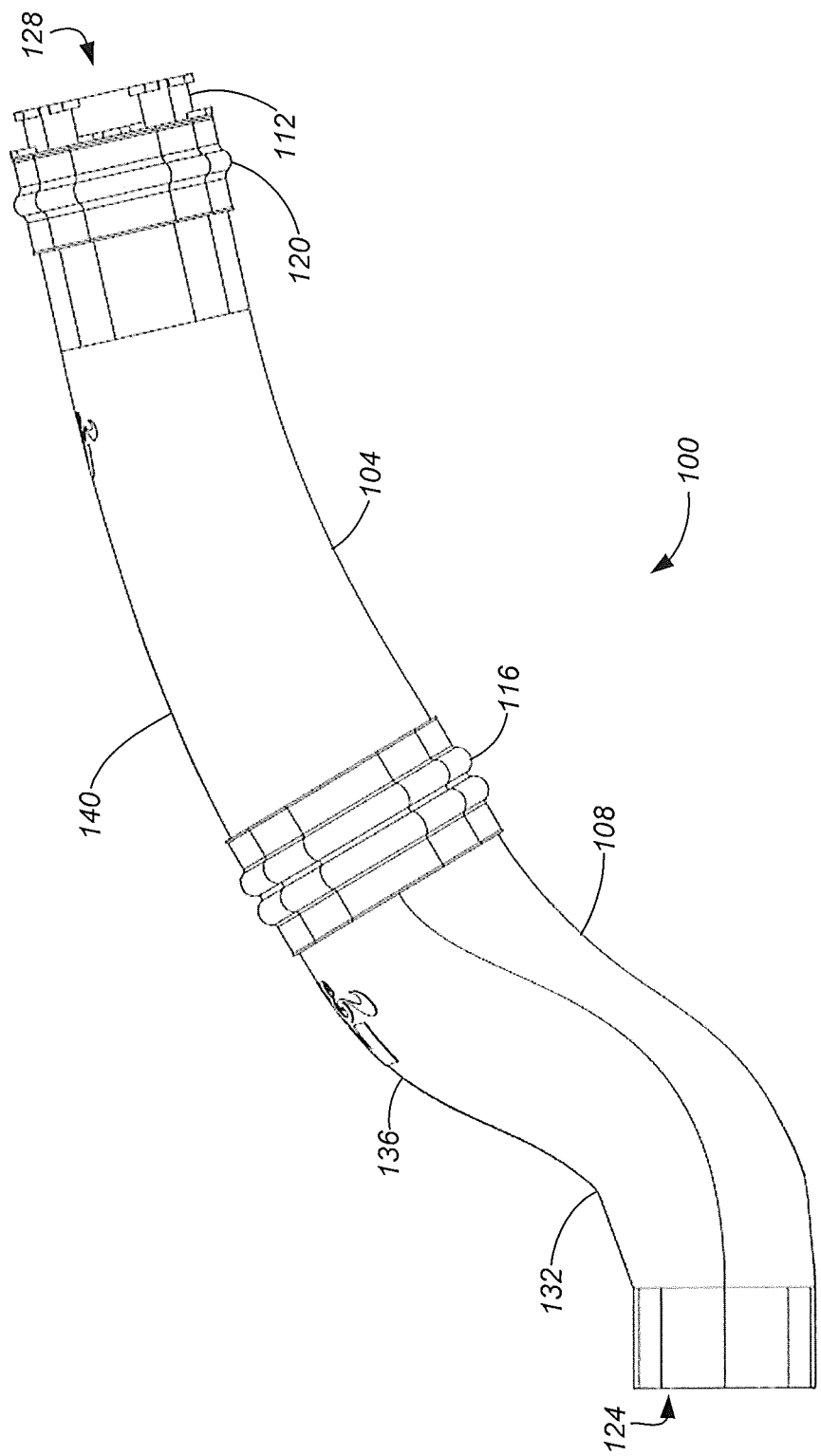
FIG. 3 illustrates a side plan view of the air intake assembly of FIG. 1, showing exemplary dimensions in inches according to the present disclosure.

FIGS. 1-3 illustrate an exemplary embodiment of an air intake assembly 100 configured for use with vehicles comprising internal combustion engines that are configured for Pro Stock drag racing and equipped with EFI systems. FIG. 1 illustrates an exploded perspective view of the air intake assembly 100, according to the present disclosure. The air intake assembly 100 generally comprises an air duct 104 that extends proximally from an air inlet 108 to a throttle body adapter 112. The throttle body adapter 112 is configured to establish an airtight coupling between the air intake assembly 100 and a throttle body of the fuel injection system (not shown).

As best illustrated in FIGS. 2A-2B, the air duct 104 and the air inlet 108 are joined by a first coupler 116. Similarly, a second coupler 120 joins the air duct 104 to the throttle body adapter 112. The air intake assembly 100 generally is configured to conduct air from a distal opening 124 of the air inlet 108 to a proximal opening 128 of the throttle body adapter 112. Preferably, the distal opening 124 is to be disposed in a forward direction at a front of the vehicle so as to direct incident air into an air intake of the engine during racing. As such, the first and second couplers 116, 120 are configured to maintain airtight seals between the air duct 104 and the air inlet 108, and between the air duct 104 and the throttle body adapter 112.

FIG. 3 illustrates a side plan view of the air intake assembly 100 and shows exemplary dimensions, expressed in inches, according to the present disclosure. A side profile of the air inlet 108 extends proximally from the distal opening 124 along a reverse curve-shape comprising an upwardly concave portion 132, followed by an upwardly convex portion 136. The air duct 104 extends proximally along a gradual curve-shape comprising an upwardly convex portion 140. As will be appreciated, the curve-shapes of the air inlet 108 and the air duct 104 are configured to provide an advantageously direct route for air to be conducted from the front of the vehicle to the throttle body while also avoiding various components that may be installed on the engine, or within the engine bay of the vehicle. As such, it should be appreciated that various shapes, including but not limited to various curves, bends, and straight portions, may be incorporated into embodiments of the air intake assembly, without limitation, and without deviating beyond the spirit and scope of the present disclosure.

Figure 4A:
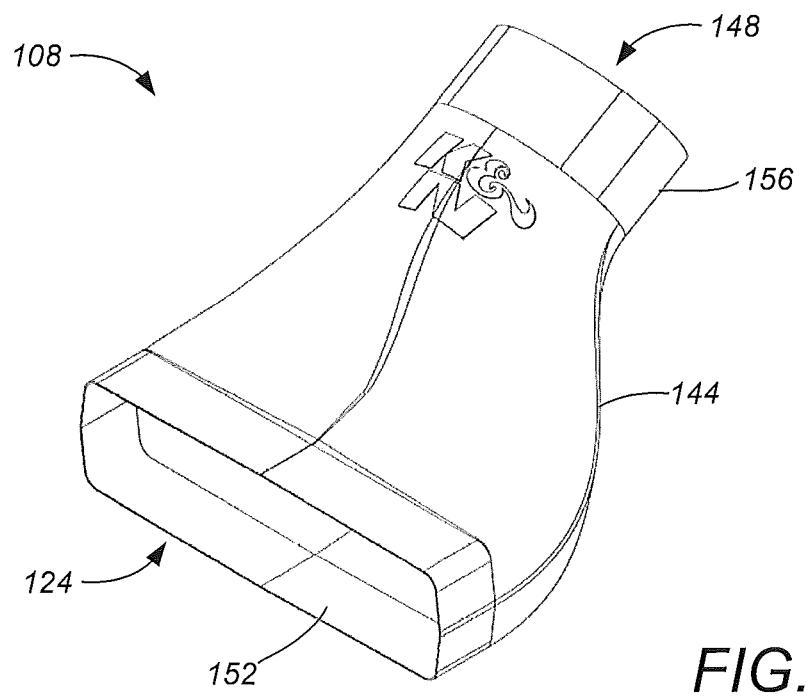
FIG. 4A illustrates a perspective view of an exemplary embodiment of an air inlet, in accordance with the present disclosure.
Figure 4B:
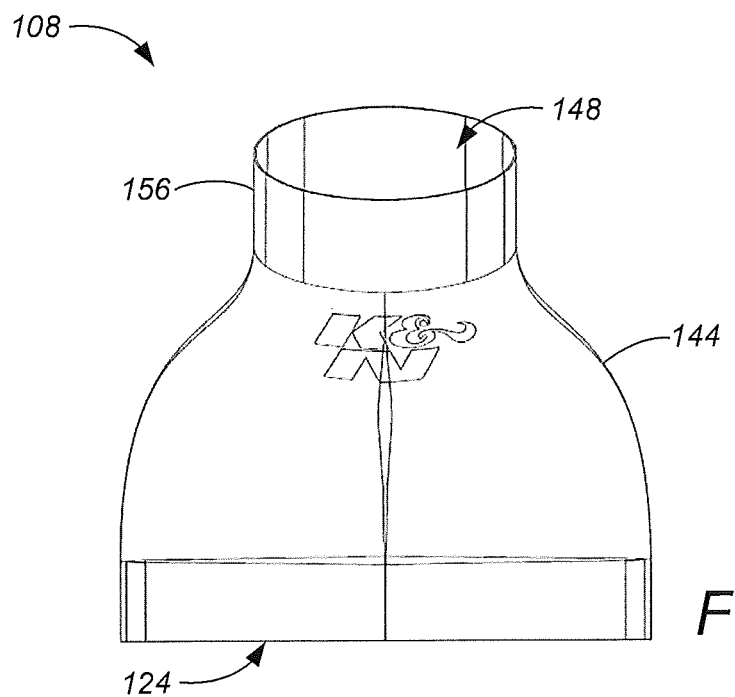
FIG. 4B illustrates a top plan view of the air inlet of FIG. 4A, showing exemplary dimensions in inches, according to the present disclosure.
Figure 5A:
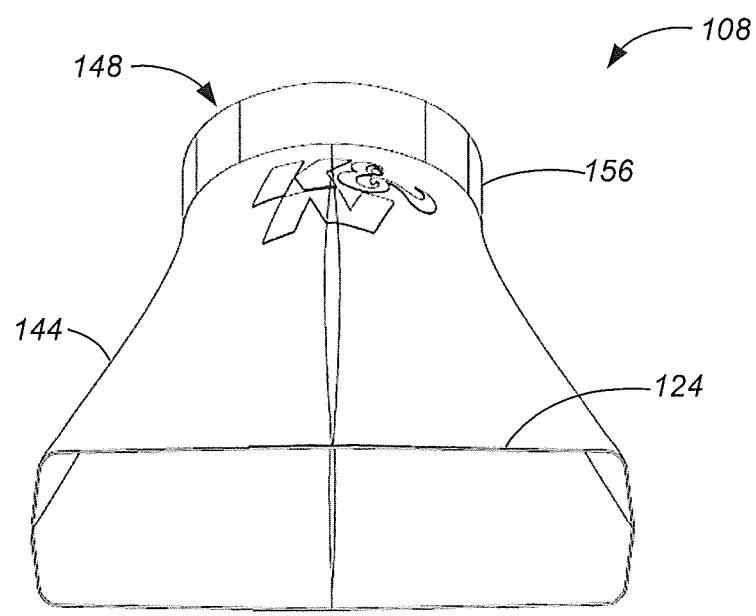
FIG. 5A illustrates a front plant view of the air inlet of FIG. 4A, showing exemplary dimensions in inches, in accordance with the present disclosure.
Figure 5B:
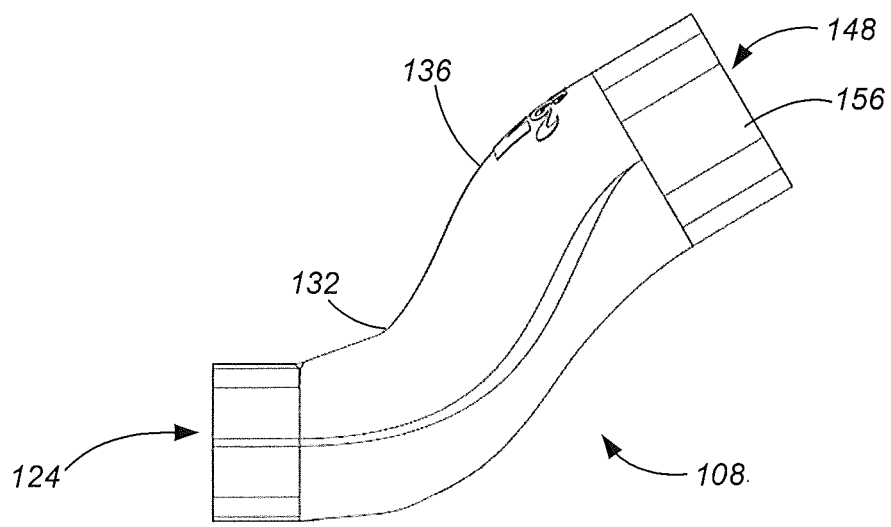
FIG. 5B illustrates a side plan view of the air inlet of FIG. 4A, showing exemplary dimensions in inches, according to the present disclosure.
Figure 6B:
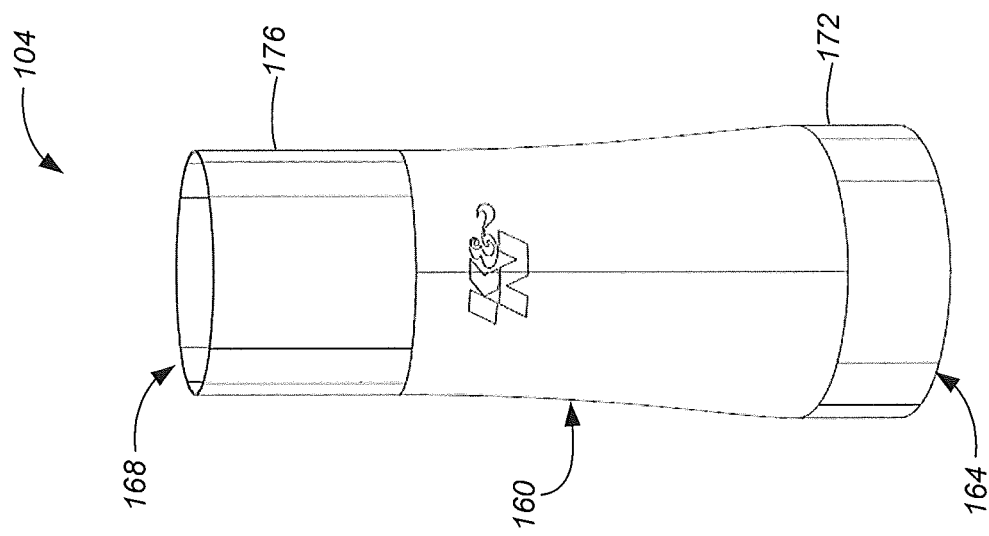
FIG. 6B illustrates a top plan view of the air duct of FIG. 6A, showing exemplary dimensions in inches, according to the present disclosure.
Figure 6A:
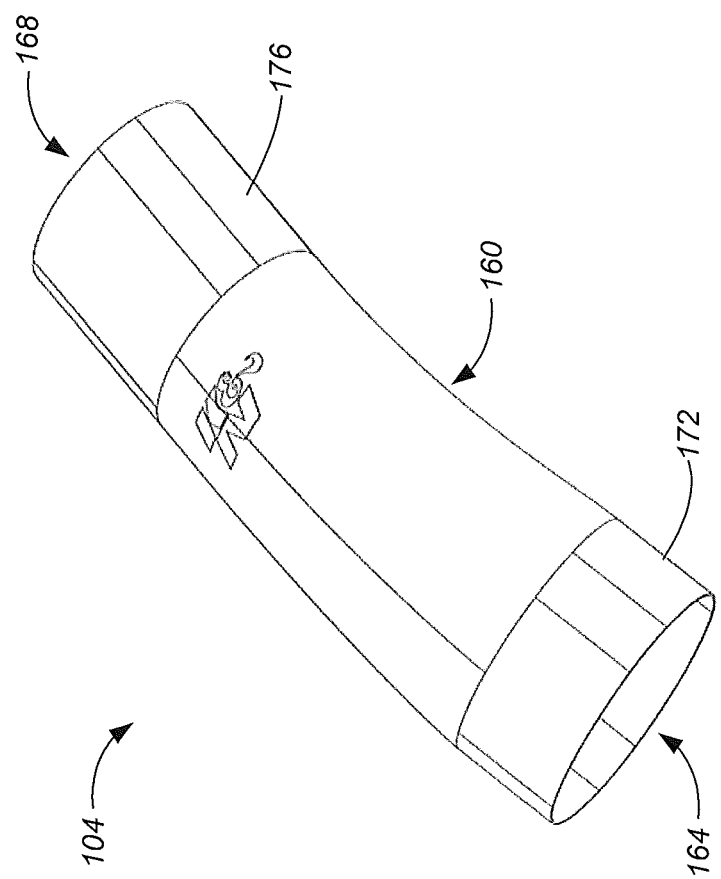
FIG. 6A illustrates a perspective view of an exemplary embodiment of an air duct, in accordance with the present disclosure.

FIGS. 4A-5B illustrate an exemplary embodiment of the air inlet 108 and show exemplary dimensions in inches, according to the present disclosure. The air inlet 108 generally is hollow and comprises a tapered portion 144 that extends from the distal opening 124 to an oval-shaped opening 148. As best illustrated in FIG. 4A, the air inlet 108 comprises a nearly rectangular cross-sectional shape at the distal opening 124 and is configured to receive a relatively large volume of incident air into the air intake assembly 100 during forward movement of the vehicle. A smooth interior surface 152 of the air inlet 108, adjacent to the distal opening 124, is configured to facilitate coupling the air inlet with other ducting components, as needed. Proximal of the distal opening 124, the cross-sectional shape of the tapered portion 144 smoothly transitions from the rectangular shape of the opening 124 to the oval-shaped of the opening 148. As best shown in FIG. 5B, the tapered portion 144 further comprises the curves 132, 136, as described above in connection with FIG. 3.

The oval-shaped opening 148 is configured to smoothly couple with the air duct 104 by way of the first coupler 116 so as to conduct an airstream from the air inlet 108 to the air duct 104 with relatively little turbulence. A smooth exterior surface 156 of the air inlet 108, adjacent to the opening 148, is configured to receive the first coupler 116. As will be appreciated, the portion of the air inlet 108 adjacent to the oval-shaped opening 148 preferably comprises a shape and diameter that match the shape and diameter of the first coupler 116 so as to receive an interior surface of the first coupler onto the smooth exterior surface 156, thereby forming a substantially airtight seal therebetween.

FIGS. 6A-7B illustrate an exemplary embodiment of the air duct 104 and show exemplary dimensions in inches, according to the present disclosure. The air duct 104 generally is an elongate tube 160 comprising a distal inlet opening 164 and a proximal throttle opening 168. As discussed above with reference to FIG. 3, and as best shown in FIG. 7B, the air duct 108 comprises an upwardly convex portion 140 extending from the distal inlet opening 164 to the throttle opening 168. Further, the shape and size of the air duct 104 generally tapers from the shape and size of the distal inlet opening 164 to the shape and size of the proximal throttle opening 168, as shown in FIG. 6B. It will be appreciated, therefore, the air duct 104 is configured to conduct the airstream received from the air inlet 108 to the throttle body of the fuel injection.

The distal inlet opening 164 comprises a substantially oval cross-sectional shape and a size that are substantially similar to the shape and size of the oval-shaped opening 148 of the air inlet 108 so as to provide a relatively smooth transfer of the airstream from the air inlet 108 into the air duct 104. A smooth exterior surface 172 adjacent to the distal inlet opening 164 is configured to mate with an interior surface of the first coupler 116 so as to form an airtight seal between the air duct 104 and the air inlet 108. Similarly, the proximal throttle opening 168 comprises a substantially oval cross-sectional shape and a size that are substantially similar to the shape and size of the throttle body adapter 112. A smooth exterior surface 176 of the air duct 104, adjacent to the throttle opening 168, is configured to mate with an interior surface of the second coupler 120 so as to form an airtight seal between the air duct 104 and the throttle body of the fuel injection. As will be appreciated, interior surfaces of the air duct 104, as well as the first and second couplers 116, 120 are configured to convey the airstream through the air duct with relatively little air turbulence.

FIGS. 8A-8B illustrate an exemplary embodiment of the first coupler 116 configured for use with the air intake assembly 100 in accordance with the present disclosure. The first coupler 116 generally is a short, hollow tube having an oval cross-sectional shape and a size that are substantially similar to the shape and size of the oval-shaped opening 148 and the distal inlet opening 164. Preferably, the first coupler 116 is comprised of a pliable material, such as rubber, so as to provide a flexible junction between the air duct 104 and the air inlet 108. As will be appreciated, the first coupler 116 generally may be fastened to the air duct 104 and the air inlet 108 by way of suitable fasteners, such as hose clamps and the like. In some embodiments, however, the first coupler 116 may be configured to rely on friction alone to maintain airtight seals with the air duct 104 and the air inlet 108.

As best shown in FIG. 8B, the first coupler 116 comprises a distal portion 180 and a proximal portion 184 that share an intervening flexible portion 188. An interior surface 192 of the distal portion 180 is configured to mate with the smooth exterior surface 156 of the air inlet 108. A circumferentially disposed chamfer 196 at the distal-most edge of the interior surface 192 facilitates inserting the smooth exterior surface 156 into the distal portion 180 during installation of the air intake assembly 100. Similarly, an interior surface 200 of the proximal portion 184 is configured to mate with the smooth exterior surface 172 of the air duct 104. A chamfer 204 is circumferentially disposed at a proximal-most edge of the interior surface 200 so as to facilitate inserting the smooth exterior surface 172 into the proximal portion 184 during installation of the air intake assembly 100.

A circumferential lip 208 is disposed at a distal-most edge of the interior surface 200, adjacent to the flexible portion 188. The circumferential lip 208 prevents the distal-most edge of the air duct 104 from being pushed into the flexible portion 188 and provides a smooth transitional surface that extends from the flexible portion 188 to the distal-most edge of the air duct 104, The smooth transitional surface substantially eliminates air turbulence that would otherwise be induced in the airstream by the distal-most edge of the air duct 104. Further, the circumferential lip 208 provides an optimal depth to which the air duct 104 may be inserted into the proximal portion 184, thereby simplifying an optimal installation of the air intake assembly 100.

It will be recognized by those skilled in the art that the engine may undergo movement relative to the surrounding engine bay, particularly during instances wherein the engine generates relatively high power and torque, such as during drag racing. Once the air inlet 108 and the air duct 104 are both inserted into the first coupler 116, the intervening flexible portion 188 provides a degree of flexibility between the air duct 104 and the air inlet 108. As will be appreciated, the intervening flexible portion 188 reduces mechanical stresses on the air intake assembly 100 that may otherwise occur during movement of the engine relative to the engine bay.

FIGS. 9A-9B illustrate an exemplary embodiment of the second coupler 120 configured for use with the air intake assembly 100 in accordance with the present disclosure. The second coupler 120 generally is a short, hollow tube having an oval cross-sectional shape and a size that are substantially similar to the shape and size of the proximal throttle opening 168 and the throttle body adapter 112. Similar to the first coupler 116, the second coupler 120 preferably is comprised of a pliable material, such as rubber, so as to provide a flexible union between the air duct 104 and the throttle body adapter 112. The second coupler 120 may be fastened to the air duct 104 and the throttle body adapter 112 by way of suitable fasteners, such as hose clamps and the like. In some embodiments, the second coupler 120 may be configured to rely solely on friction to maintain airtight seals with the air duct 104 and the throttle body adapter 112.

It will be appreciated that many aspects of the second coupler 120 are similar to those of the first coupler 116. As such, the second coupler 120 comprises a distal portion 212 and a proximal portion 216 that share a pair of intervening flexible portions 220. An interior surface 224 of the distal portion 212 is configured to mate with the smooth exterior surface 176 of the air duct 104. A chamfer 228 is disposed circumferentially along the distal-most edge of the interior surface 224. The chamfer 228 facilitates inserting the air duct 104 into the distal portion 212 during installation of the air intake assembly 100. Likewise, an interior surface 232 of the proximal portion 216 is configured to mate with an exterior surface 236 of the throttle body adapter 112, as shown in FIG. 10B. A circumferential chamfer 240 is disposed at a proximal-most edge of the proximal portion 216 so as to facilitate receiving the throttle body adapter 112 during installation of the air intake assembly 100.

The pair of flexible portions 220 provide a degree of flexibility between the air duct 104 and the throttle body adapter 112 during movement of the engine within the engine bay, as typically occurs when the engine produces relatively high power output. The flexible portions 220 cooperate with the flexible portion 188 to substantially eliminate mechanical stresses on the air intake assembly 100 and the throttle body of the fuel injection that may otherwise occur during movement of the engine relative to the engine bay.

Figure 10A:
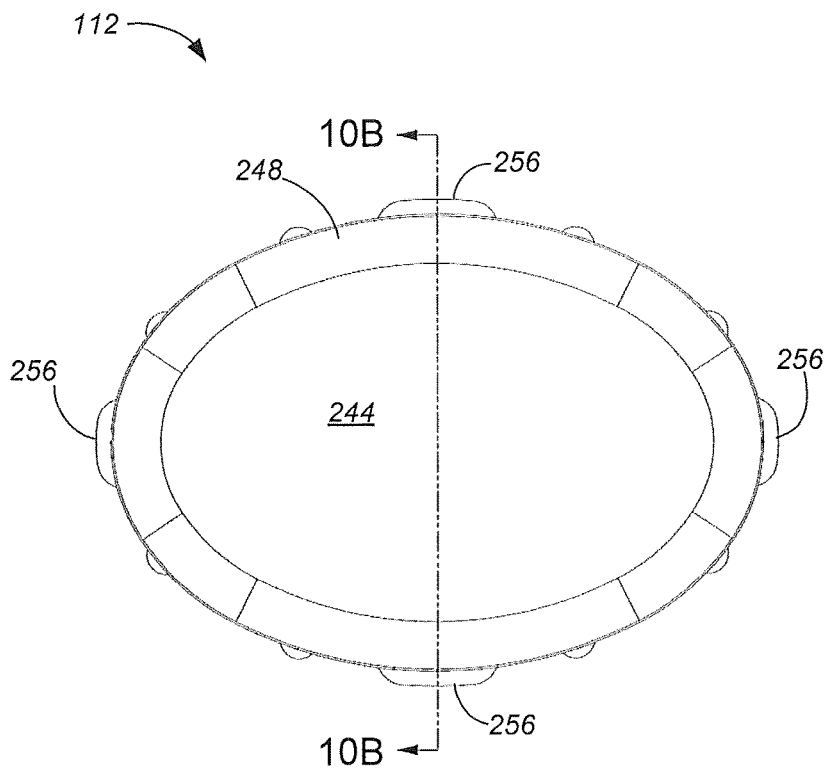
FIG. 10A illustrates a front plan view of an exemplary embodiment of a throttle body adapter configured for use with an air intake assembly in accordance with the present disclosure.
Figure 10B:
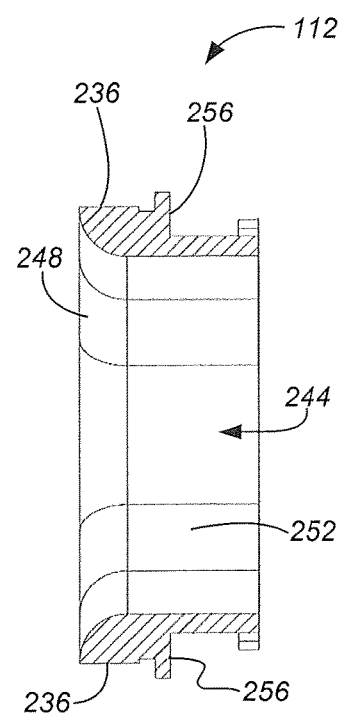
FIG. 10B illustrates a cross-sectional view of the throttle body adapter of FIG. 10A, taken along a line 10B-10B, according to the present disclosure.
Figure 10C:
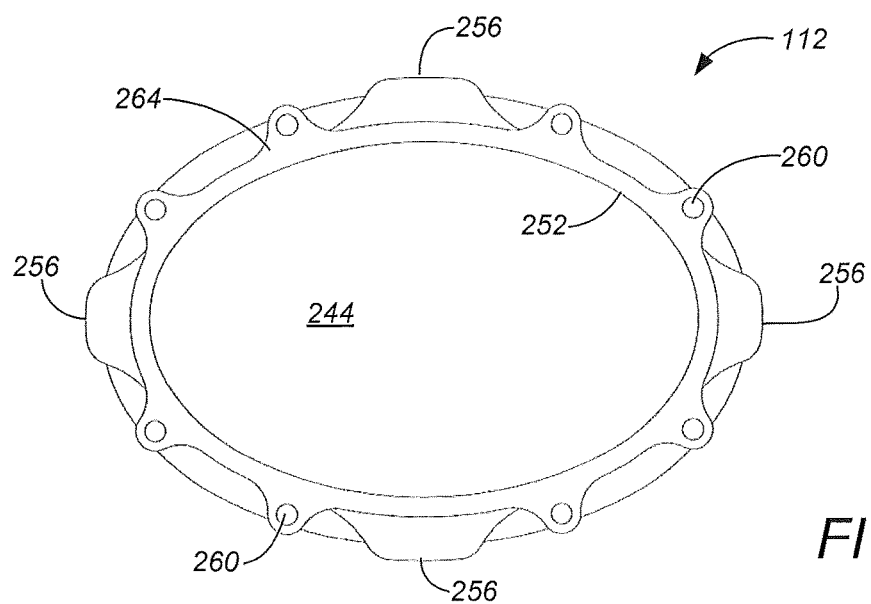
FIG. 10C illustrates a rear plan view of the throttle body adapter of FIG. 10A, in accordance with the present disclosure.

FIGS. 10A-10C illustrate an exemplary embodiment of the throttle body adapter 112 configured for use with the air intake assembly 100, according to the present disclosure. As will be appreciated by those skilled in the art, the throttle body adapter 112 generally is configured to provide a coupling between the air duct 104 and the throttle body of the fuel injection so as to conduct the airstream from the air duct 104 to the throttle body. As such, the throttle body adapter 112 is proximally configured to be fastened to the throttle body, and is distally configured to be joined with the air duct 104 by way of the second coupler 120. A central opening 244 within the throttle body adapter 112 is configured to conduct the airstream to the throttle body with advantageously little air turbulence. A rounded portion 248 of the central opening 244 provides a smooth transition surface configured to substantially eliminate turbulence arising within the airstream passing from the air duct 104 into the throttle body adapter 112. Further, the central opening 244 comprises an inner surface 252 configured to encourage laminar air flow through the throttle body adapter 112.

The throttle body adapter 112 comprises a shape and a size such that the exterior surface 236 mates with the interior surface 232 of the second coupler 120, as described above. A plurality of ridges 256 are disposed uniformly around the circumference of the throttle body adapter 112, adjacent to the exterior surface 236. The ridges 256 are configured to limit the depth with which the throttle body adapter 112 may be inserted into the proximal portion 216 of the second coupler 120, and thus prevents the throttle body adapter 112 from being inserted into the flexible portions 220. In the embodiment illustrated in FIG. 10A, four ridges 256 are incorporated into the throttle body adapter 112. In some embodiments, however, the throttle body adapter 112 may comprise either more or less than four ridges 256. Furthermore, in other embodiments, any of various structural features, such as circumferentially disposed lips, protrusions, or recesses, may be incorporated into the throttle body adapter 112, without limitation, to limit the depth with which the throttle body adapter may be inserted into the second coupler 120.

As best shown in FIG. 10C, the throttle body adapter 112 is proximally configured to be coupled with the throttle body of the fuel injection. As such, the shape and size of the central opening 244 is substantially identical to the shape and size of a throat of the throttle body. It will be recognized that matching the shape and size of the throttle body adapter 112 and the throat of the throttle body reduces turbulence within the airstream passing from the central opening 244 into the throttle body.

The throttle body adapter 112 further comprises a plurality of holes 260 configured to receive suitable fasteners, such as threaded bolts, so as to couple the throttle body adapter 112 to the throttle body. In general, the holes 260 are positioned advantageously around the perimeter of the throttle body adapter 112. As will be recognized, however, the positions and sizes of the holes 260 preferably match the positions and sizes of threaded holes disposed within the throttle body. A proximal-most peripheral surface 264 is configured to mate with a smooth surface of the throttle body, thereby forming an airtight seal therebetween once the throttle body adapter 112 is fastened to the throttle body. As will be appreciated, a gasket preferably may be placed between the peripheral surface 264 and the smooth surface of the throttle body so as to prevent unwanted air from entering into the airstream. It should be understood that the layout of the peripheral surface 264, as well as the sizes and arrangement of the holes 260 depend upon the make and model of the throttle body. As such, the holes 260 and the peripheral surface 264 may be implemented in a wide variety of different configurations, without limitation, and without deviating beyond the spirit and scope of the present disclosure.

While the invention has been described in terms of particular variations and illustrative figures, those of ordinary skill in the art will recognize that the invention is not limited to the variations or figures described. In addition, where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, as well as performed sequentially as described above. To the extent there are variations of the invention, which are within the spirit of the disclosure or equivalent to the inventions found in the claims, it is the intent that this patent will cover those variations as well. Therefore, the present disclosure is to be understood as not limited by the specific embodiments described herein, but only by scope of the appended claims.

What is claimed is:

1. An air intake assembly configured for use with a vehicle comprising an engine equipped with a throttle body electronic fuel injection (EFI), the air intake assembly comprising:
    an air inlet configured to be disposed at a front of the vehicle, the air inlet having a first distal end of a first shape and a first proximal end of a second shape, the air inlet having a first cross-section that tapers between the first shape of the first distal end of the air inlet to the second shape of the first proximal end of the air inlet, and wherein the taper of the air inlet is comprised of a reverse curve-shape that extends proximally from the first distal end of the air inlet toward the first proximal end of the air inlet, the reverse curve comprising an upwardly concave portion that is followed by an upwardly convex portion;
    an air duct to receive incident air from the air inlet, the air duct having a second distal end and a second proximal end, the air duct having a second cross-section that tapers from the second distal end to the second proximal end; and
    a throttle body adapter coupled to the second proximal end of the air duct.

2. The air intake assembly of claim 1, wherein a first coupler is configured to maintain an airtight seal between the air inlet and the air duct.

3. The air intake assembly of claim 2, wherein the first coupler is configured with a shape and a size that substantially match a shape and a size of an opening comprising each of the air inlet and the air duct, such that one or more interior surfaces of the first coupler may be received onto smooth exterior surfaces of the air inlet and the air duct so as to form a substantially airtight seal therebetween.

4. The air intake assembly of claim 2, wherein the first coupler is comprised of a distal portion and a proximal portion that share an intervening flexible portion configured to allow movement between the air duct and the air inlet.

5. The air intake assembly of claim 4, wherein the first coupler is comprised of a circumferential lip configured to prevent a distal-most edge of the air duct from being pushed into the flexible portion, the circumferential lip providing a smooth transitional surface configured to reduce air turbulence within an airstream flowing near the distal-most edge of the air duct.

6. The air intake assembly of claim 1, wherein a second coupler is configured to maintain an airtight seal between the air duct and the throttle body adapter, such that the incident air is directed to a proximal opening of the throttle body adapter.

7. The air intake assembly of claim 6, wherein the second coupler is configured with a shape and a size that substantially match a shape and a size of an opening comprising each of the air duct and the throttle body adapter, such that one or more interior surfaces of the second coupler may be received onto smooth exterior surfaces of the air duct and the throttle body adapter, such that the incident air is directed to a proximal opening of the throttle body adapter.

8. The air intake assembly of claim 7, wherein the second coupler is comprised of a distal portion and a proximal portion that share a pair of intervening flexible portions configured to allow movement of the air duct relative to the throttle body adapter.

9. The air intake assembly of claim 1, wherein the air inlet and the air duct are configured to provide a direct route for air to be conducted from the front of the vehicle to a proximal opening of the throttle body adapter.

10. The air intake assembly of claim 9, wherein the air inlet is comprised of a substantially rectangular cross-sectional shape at a distal opening that is configured to receive a volume of the incident air during forward movement of the vehicle.

11. The air intake assembly of claim 1, wherein the air duct comprises an elongate tube having a shape and size that taper from a distal inlet opening to a proximal throttle opening, the distal inlet opening being comprised of a shape and a size that are substantially similar to a shape and a size of a proximal opening of the air inlet, thereby providing a smooth transfer of an airstream from the air inlet into the air duct.

12. The air intake assembly of claim 11, wherein the proximal throttle opening is comprised of a cross-sectional shape and a size that are substantially similar to a cross-sectional shape and a size of the throttle body adapter.

13. The air intake assembly of claim 1, wherein the throttle body adapter is comprised of a proximal portion and a distal portion configured to be joined with the air duct by way of the second coupler.

14. The air intake assembly of claim 13, wherein a central opening comprising the throttle body adapter is configured to conduct an airstream to a proximal opening of the throttle body adapter, an inner surface of the central opening being configured to facilitate laminar air flow of the airstream.

15. A method for an air intake assembly for use with a vehicle comprising an engine equipped with an electronic fuel injection (EFI), comprising:

configuring an air inlet to direct incident air at a front of the vehicle into the air intake assembly, wherein the air inlet includes a first distal end of a first shape and a first proximal end of a second shape, the air inlet having a first cross-section that tapers between the first shape of the first distal end of the air inlet to the second shape of the first proximal end of the air inlet, and wherein the taper of the air inlet is comprised of a reverse curve-shape that extends proximally from the first distal end of the air inlet toward the first proximal end of the air inlet, the reverse curve comprising an upwardly concave portion that is followed by an upwardly convex portion;

maintaining an airtight seal between the air inlet and an air duct by way of a first coupler, wherein the air duct includes a second distal end and a second proximal end, the air duct having a second cross-section that tapers from the second distal end to the second proximal end;

joining the air duct with a throttle body adapter by way of a second coupler; and directing the incident air through the throttle body adapter via the second coupler.

16. The method of claim 15, wherein configuring the air inlet further comprises forming the air inlet and the air duct to provide a direct route for the incident air to be conducted from the front of the vehicle to a proximal opening of throttle body adapter.

17. The method of claim 15, wherein joining further comprises configuring a distal portion of the throttle body adapter to be coupled with the air duct by way of the second coupler.

18. The method of claim 15, wherein directing further comprises configuring a central opening of the throttle body adapter to facilitate laminar flow of the incident air being conducted to a proximal opening of the throttle body adapter.

19. The air intake assembly of claim 1, wherein the first shape is a rectangular shape and the second shape is an oval shape.

20. The method of claim 15, wherein the first shape is a rectangular shape and the second shape is an oval shape.

* * * * *